(12) United States Patent
Lee et al.

(10) Patent No.: US 12,046,546 B2
(45) Date of Patent: Jul. 23, 2024

(54) PACKAGE SUBSTRATE AND SEMICONDUCTOR PACKAGE INCLUDING SAME

(71) Applicant: SAMSUNG ELECTRONICS CO., LTD., Suwon-si (KR)

(72) Inventors: Shlege Lee, Seoul (KR); Dongok Kwak, Hwaseong-si (KR); Sunwoo Han, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 229 days.

(21) Appl. No.: 17/568,345

(22) Filed: Jan. 4, 2022

(65) Prior Publication Data
US 2023/0005831 A1 Jan. 5, 2023

(30) Foreign Application Priority Data

Jul. 2, 2021 (KR) ........................ 10-2021-0087428

(51) Int. Cl.
*H01L 23/538* (2006.01)
*H01L 23/00* (2006.01)
(Continued)

(52) U.S. Cl.
CPC .... *H01L 23/49838* (2013.01); *H01L 23/3128* (2013.01); *H01L 23/49811* (2013.01);
(Continued)

(58) Field of Classification Search
CPC ........... H01L 23/49838; H01L 23/3128; H01L 23/49811; H01L 23/49822; H01L 23/5385; H01L 23/5389; H01L 24/16; H01L 25/18; H01L 2224/16227; H01L 23/49816; H01L 23/49894; H01L 25/105; H01L 2224/16237; H01L 2224/16238; H01L 2224/48227; H01L 2225/1023; H01L 2225/1041; H01L 2225/1058; H01L 2225/107; H01L 2924/15311; H01L 2924/3512; H01L 23/562; H01L 23/528; H01L 23/485; H01L 23/5226;
(Continued)

(56) References Cited

U.S. PATENT DOCUMENTS 5,706,178 A 1/1998 Barrow
9,524,931 B2 12/2016 Shiraki
(Continued)

FOREIGN PATENT DOCUMENTS

JP 2012-009778 1/2012
JP 2014-075457 4/2014
(Continued)

*Primary Examiner* — Elias Ullah
(74) *Attorney, Agent, or Firm* — Fish & Richardson P.C.

(57) ABSTRACT

A package substrate includes; a conductive line extending in a first horizontal direction, a conductive pad on an upper surface of the package substrate and horizontally spaced apart from the conductive line in a second horizontal direction, and a protective layer covering the conductive line and including an opening selectively exposing a portion of the conductive pad. The opening has an elongated elliptical shape having a minor axis defined by a width extending in the first horizontal direction and a major axis defined by a length extending in the second horizontal direction.

20 Claims, 13 Drawing Sheets

(51) Int. Cl.
    *H01L 23/31*        (2006.01)
    *H01L 23/498*     (2006.01)
    *H01L 25/18*       (2023.01)

(52) U.S. Cl.
    CPC .... *H01L 23/49822* (2013.01); *H01L 23/5385* (2013.01); *H01L 23/5389* (2013.01); *H01L 24/16* (2013.01); *H01L 25/18* (2013.01); *H01L 2224/16227* (2013.01)

(58) Field of Classification Search
    CPC . H01L 23/5383; H01L 23/5386; H01L 24/02; H01L 2224/0235
    See application file for complete search history.

(56) References Cited

U.S. PATENT DOCUMENTS

| | | |
|---|---|---|
| 10,683,177 B2 | 6/2020 | Mccloskey et al. |
| 2007/0035009 A1 | 2/2007 | Hwang et al. |
| 2021/0296269 A1* | 9/2021 | Sharangpani ........... H01L 24/06 |

FOREIGN PATENT DOCUMENTS

| | | |
|---|---|---|
| KR | 10-0283252 | 6/2001 |
| KR | 10-2007-0019475 | 2/2007 |

* cited by examiner

PACKAGE SUBSTRATE AND SEMICONDUCTOR PACKAGE INCLUDING SAME

CROSS-REFERENCE TO RELATED APPLICATION

This application claims priority under 35 U.S.C. § 119 to Korean Patent Application No. 10-2021-0087428 filed on Jul. 2, 2021 in the Korean Intellectual Property Office, the subject matter of which is hereby incorporated by reference in its entirety.

BACKGROUND

The inventive concept relates generally to package substrates and semiconductor packages including same.

Package substrates often include a multiplicity of conductive pads and conductive lines variously connected to the conductive pads. A protective layer may be used to cover the conductive lines and portions of the conductive pads. For example, a center portion of each conductive pad may be selectively exposed through an opening formed in the protective layer.

However, when the center of the conductive pad is misaligned with a center of the opening in the protective layer, a crack caused by applied thermal or mechanical stress may extend (or propagate) in a direction perpendicular to the direction of the misalignment from a point at which an outer edge of the conductive pad meets an outer edge of the opening. Unfortunately, such cracks may extend through a nearby conductive line to cut (wholly or in part) the conductive line. This outcome, caused by the misalignment between the center of the conductive pad and the center of the protective layer opening, may decrease the durability and overall reliability of the package substrate, as well as a semiconductor package incorporating the package substrate.

SUMMARY

Embodiments of the inventive concept provide package substrates exhibiting improved durability and reliability, as well as more reliable semiconductor packages including same.

According to an aspect of the inventive concept, there is provided a package substrate including; a first conductive line extending in a first horizontal direction, a first conductive pad on an upper surface of the package substrate and horizontally spaced apart from the first conductive line in a second horizontal direction, and a protective layer covering the first conductive line and including a first opening selectively exposing a portion of the first conductive pad, wherein the first opening has an elliptical shape having a minor axis defined by a first width extending in the first horizontal direction and a major axis defined by a first length extending in the second horizontal direction.

According to another aspect of the inventive concept, there is provided a semiconductor package including; a first package substrate, a first semiconductor chip mounted on the first package substrate, a second package substrate on the first semiconductor chip, an inter-substrate connection structure connecting the first package substrate and the second package substrate;

a third package substrate on the second package substrate, and an inter-sub-package connection member between the second package substrate and the third package substrate. The second package substrate includes; a first conductive line extending in a first horizontal direction, a first conductive pad exposed on an upper surface of the second package substrate in contact with the inter-sub-package connection member, and spaced apart from the first conductive line in the second horizontal direction, and a protective layer covering the first conductive line and including a first opening selectively exposing a portion of the first conductive pad, wherein the first opening has an elliptical shape having a minor axis defined by a first width extending in the first horizontal direction and a major axis defined by a first length extending in the second horizontal direction.

According to another aspect of the inventive concept, there is provided a semiconductor device including; a package substrate including a first package edge extending in a first horizontal direction, a second package edge extending in a second horizontal direction, and a chip region including a first chip edge extending in the first horizontal direction, a second chip edge extending in the second horizontal direction, a protective layer covering an upper surface of the package substrate and including an opening, a conductive pad including a center portion exposed through the opening of the protective layer and an outer portion covered by the protective layer, wherein the opening has an elongated elliptical shape having a minor axis and a major axis, and a directional orientation of the major axis is perpendicular to a closest one of the first package edge, the second package edge, the first chip edge and the second chip edge.

BRIEF DESCRIPTION OF THE DRAWINGS

The making and use of the inventive concept may be more clearly understood upon consideration of the following detailed description together with the accompanying drawings in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

In this regard, various embodiments of the inventive concept may be described in terms of an assumed geometric space that may be defined in accordance with a first horizontal direction (e.g., an X direction), a second horizontal direction (e.g., a Y direction) and a vertical direction (e.g., a Z direction). Those skilled in the art will appreciate, however, that such a geometric space may be arbitrarily overlaid and/or rotated in relation to various embodiments of the inventive concept to better describe relative relationships between various elements, components, and/or directions.

Figure 1A:
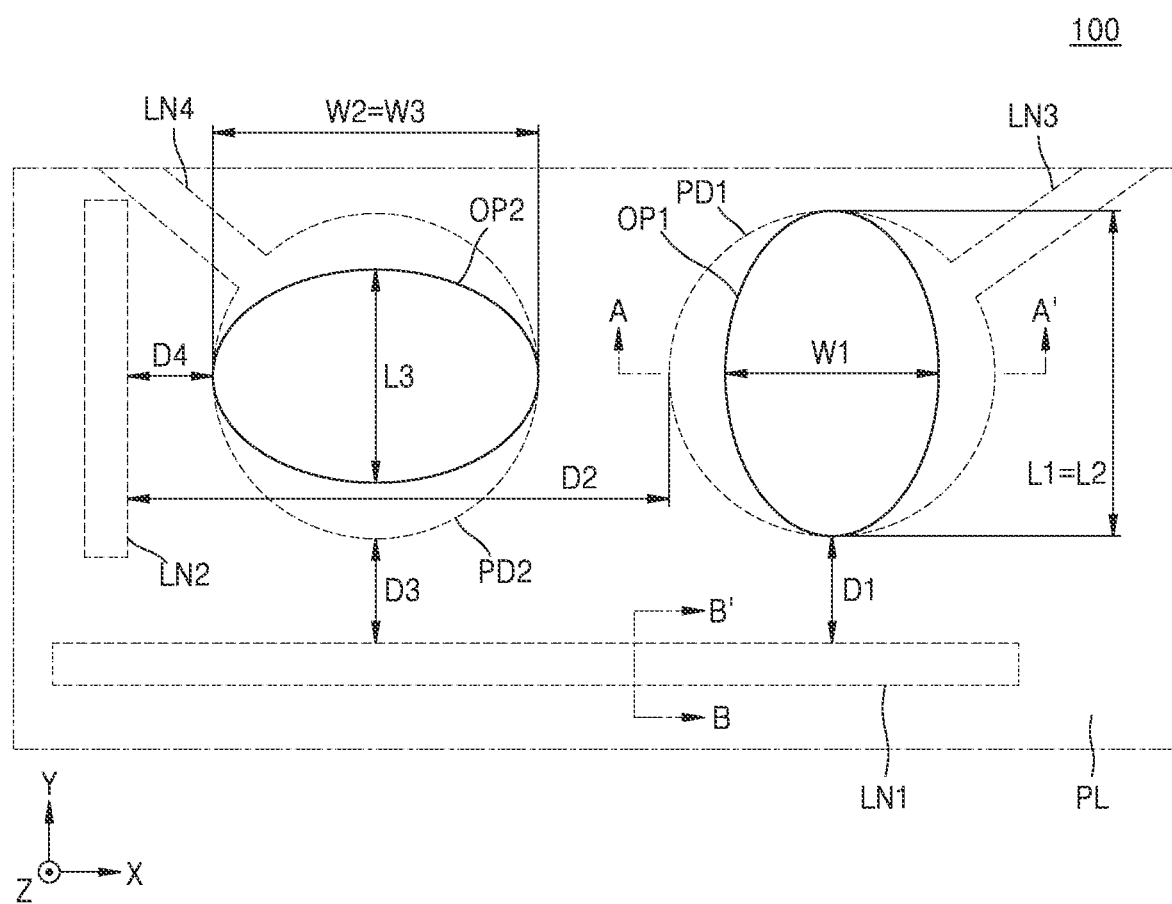
FIG. 1A is a plan view of a package substrate according to embodiments of the inventive concept.
Figure 1B:
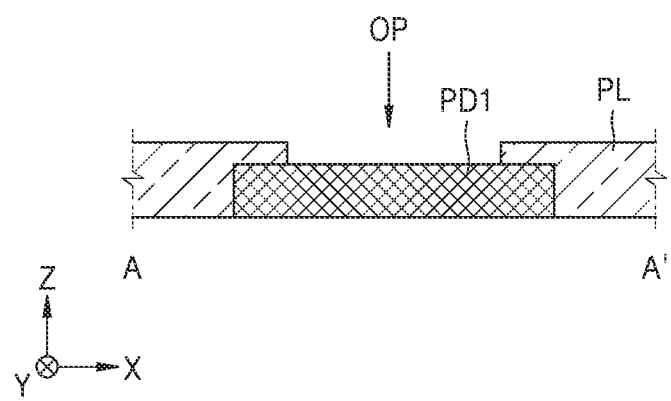
FIG. 1B is a cross-sectional view of the package substrate of FIG. 1A taken along line A-A'.
Figure 1C:
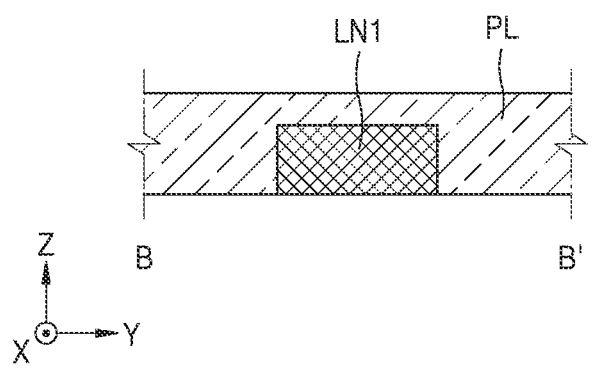
FIG. 1C is a cross-sectional view of the package substrate of FIG. 1A taken along line B-B'.

FIG. 1A is a plan (or top-down) view illustrating a package substrate 100 according to embodiments of the inventive concept, FIG. 1B is a cross-sectional view of the package substrate 100 taken along line A-A' of FIG. 1A, and FIG. 1C is a cross-sectional view of the package substrate 100 taken along line B-B' of FIG. 1A.

Referring to FIGS. 1A, 1B and 1C, the package substrate 100 may include a first conductive line LN1, a first conductive pad PD1, and a protective layer PL. The first conductive line LN1 may extend in a first horizontal (or an X) direction. The first conductive pad PD1 may be laterally (or horizontally) spaced apart (e.g., in a second horizontal (or a Y) direction intersecting the first horizontal direction) from the first conductive line LN1. Although not specifically illustrated in FIGS. 1A, 1B and 1C, those skilled in the art will appreciate that the first conductive line LN1 may be connected to (e.g., contact) one or more conductive pads. The protective layer PL may cover (e.g., overlay in a vertical (or a Z) direction substantially perpendicular to the first horizontal direction and the second horizontal directions) the first conductive line LN1 and portions of the first conductive pad PD1. However, the protective layer PL may include a first opening OP1 selectively exposing a portion of the first conductive pad PD1.

The first opening OP1 may have a first "width" L1 (e.g., a dimension measured in the first horizontal direction) and a first "length" L1 (e.g., a dimension measured in the second horizontal direction), wherein the first width W1 is less than the first length L1. In some embodiments, the first opening OP1 may have a substantially elliptical shape and the first conductive pad PD1 may have a substantially circular shape. Hence, a major axis of the first opening OP1 may extend in the second horizontal direction, and a minor axis substantially orthogonal to the major axis may extend in the first horizontal direction. That is, the first opening OP1 may have an elongated elliptical shape having a longer dimension (i.e., the major axis) extending in the second direction and the shorter dimension (i.e., a minor axis) extending in the first horizontal direction. With this configuration, even when a misalignment between the first opening OP1 and the first conductive pad PD1 occurs, resulting cracks are much more likely to extend (or propagate) in the first horizontal direction (e.g., in parallel with the direction of extension for the first conductive line LN1). As a result, the likelihood of damage to, or cutting of the first conductive line LN1 may be markedly reduced or eliminated, thereby improving the overall durability and reliability of the package substrate 100.

In some embodiments, the first length L1 of the first opening OP1 may be substantially equal to a second length L2 of the first conductive pad PD1. Accordingly, cracking may extend in the first horizontal direction (e.g., from a point at which the outer (or circumferential) edge of the first opening OP1 and the outer edge of the first conductive pad PD1 meet. In this manner, cutting of the first conductive line LN1 due to cracking may be prevented, and the overall durability and reliability of the package substrate 100 may be improved.

In some embodiments, the package substrate 100 may further include a second conductive line LN2 extending in the second horizontal direction, wherein the first conductive pad PD1 is disposed closer to the first conductive line LN1 than to the second conductive line LN2. For example, a first distance D1 (e.g., measured in the second horizontal direction) between a closest edge of the first conductive line LN1 and the outer edge of the first conductive pad PD1 may be less than a second distance D2 (e.g., measured in the first horizontal direction) between a closest edge of the second conductive line LN2 and the outer edge of the first conductive pad PD1. Under these working assumption and in order to better protect the integrity of the first conductive line LN1 to which the first conductive pad PD1 is relatively closer, the directional orientation (e.g., along the second horizontal direction) of the major axis of the first opening OP1 may be substantially perpendicular to the directional extension (e.g., along the first horizontal direction) of the first conductive line LN1.

In some embodiments, the package substrate 100 may further include a second conductive pad PD2, wherein the second conductive pad PD2 respectively and laterally spaced apart from the first conductive line LN1, the second conductive line LN2, and the first conductive pad PD1. Here, the protective layer PL may cover the second conductive line LN2 and may cover at least a portion of the second conductive pad PD2. That is, the protective layer PL may also include a second opening OP2 selectively exposing a portion of the second conductive pad PD2.

In some embodiments, the second conductive pad PD2 may be disposed relatively closer to the second conductive line LN2 than to the first conductive line LN1. For example, a fourth distance D4 (e.g., measured in the first horizontal direction) between a closest edge of the second conductive line LN2 and an outer edge of the second conductive pad PD2 may be less than a third distance D3 (e.g., measured in the second horizontal direction) between a closest edge of the first conductive line LN1 and the outer edge of the second conductive pad PD2.

With this configuration and in order to protect the second conductive line LN2, to which the second conductive pad PD2 is relatively closer, the second opening OP2 may be relatively elongated in the first horizontal direction, the same direction in which the second conductive line LN2 extends. Accordingly, a third length L3 of the second opening OP2 may be less than a second width W2 of the second opening OP2. In some embodiments, the second opening OP2 may have a substantially elliptical shape, and the second conductive pad PD2 may have a substantially circular shape. Hence, the major axis of the second opening OP2 may be substantially perpendicular to the second horizontal direction. In some embodiments, the second width W2 of the second opening OP2 may be substantially equal to a third width W3 of the second conductive pad PD2.

In some embodiments, the package substrate 100 may further include a third conductive line LN3 extending angularly from the first conductive pad PD1. In this context, the term "angularly" denotes any direction that is different from both the first horizontal direction and the second horizontal direction. Accordingly, the directional orientation of the first opening OP1 may be determined in relation to the directional extension of the first conductive line LN1, regardless of the directional extension of the angular third conductive line LN3 connecting the first conductive pad PD1.

Likewise, the package substrate 100 may further include a fourth conductive line LN4 angularly extending from the second conductive pad PD2. Hence, the directional orientation of the second opening OP2 may be determined in relation to the directional extension of the second conductive line LN2, regardless of the directional extension of the fourth conductive line LN4 connecting the second conductive pad PD2. Here, it should be noted that the third conductive line LN3 may have a first angular direction of extension, different from a second angular direction of extension for the fourth conductive line LN4.

In some embodiments, the first length L1 of the major axis (e.g., a Y axis) of the first opening OP1 and the second width W2 of the major axis (e.g., an X axis) of the second opening OP2 may range from about 10 µm to about 400 µm, respectively. Further, respective a difference between L1 and W1, a difference between W2 and L3, a difference between L1 and W2, and a difference between W1 and L3 may range from between about 2.5 µm to about 100 µm.

Figure 2:
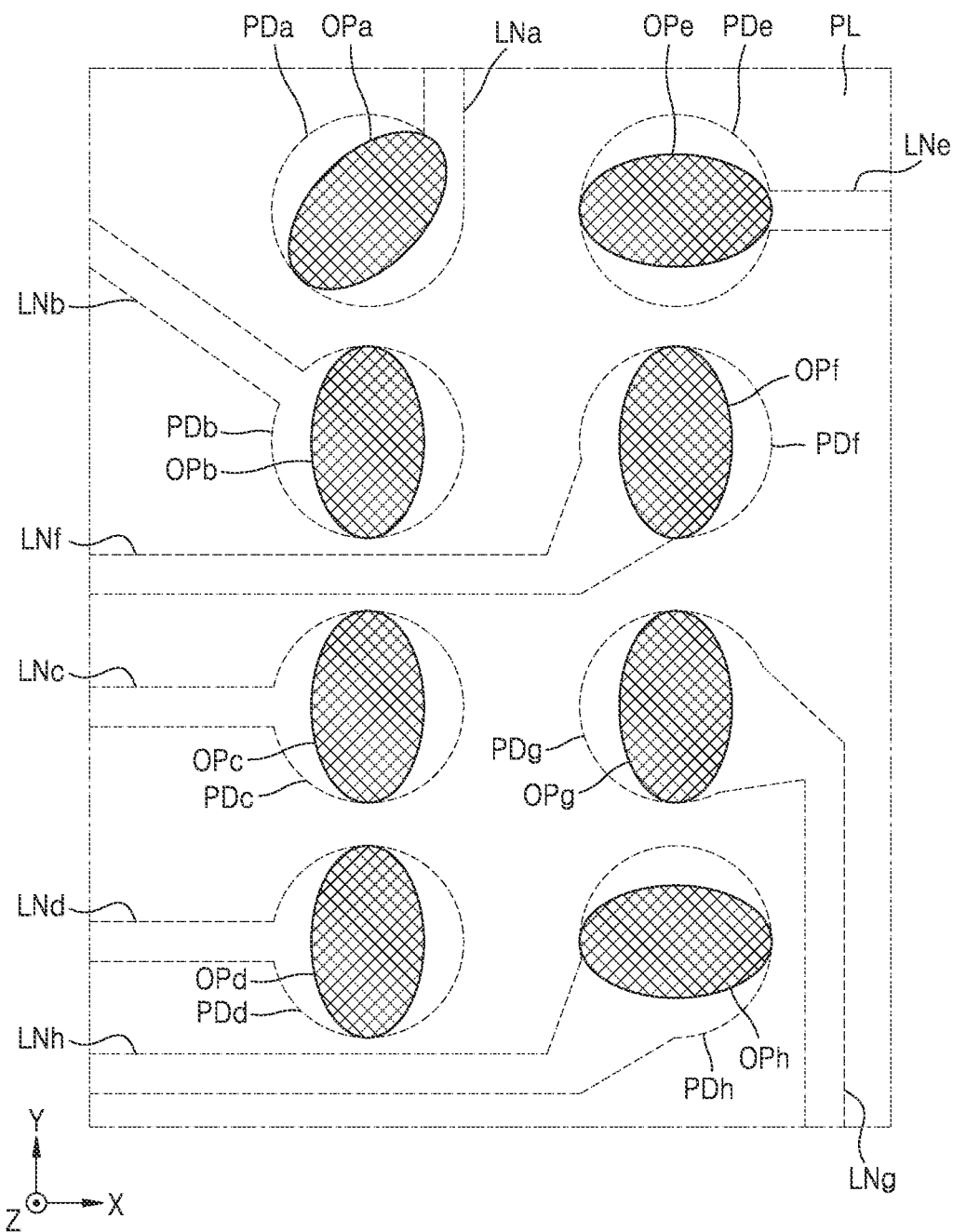
FIG. 2 is a plan view of a package substrate according to embodiments of the inventive concept.

FIG. 2 is a plan view illustrating a package substrate 100a according to embodiments of the inventive concept.

Referring to FIG. 2, the package substrate 100a may include first, second, third, fourth, fifth, sixth, seventh and eighth (hereafter collectively, "first to eighth") pads PDa through PDh, a protective layer PL, and first through eighth conductive lines LNa through LNh. Here, the protective layer PL may cover at least a portion of the first through eighth pads PDa through PDh as well as the first through eighth conductive lines LNa through LNh. Hence, the protective layer PL may include first through eighth openings OPa through OPh selectively exposing portions of the first through eighth pads PDa through PDh, respectively. That is, the protective layer PL may cover "remaining portion" of each of the first through eighth pads PDa through PDh without covering a more "center portion" of each of the first through eighth pads PDa through PDh. The first through eighth conductive lines LNa through LNh may respectively contact the first through eighth conductive pads PDa through PDh.

Each of the first through eighth openings OPa through OPh may have an elongated shape defined in terms of a major axis and a minor axis, consistent with the foregoing. Here, the directional orientation of each major axis may be substantially perpendicular to the directional extension of a "closest conductive line" among the first through eighth conductive lines LNa through LNh, without electrically contacting the closest conductive line.

For example, the directional orientation of the major axis of the first opening OPa may be substantially perpendicular to the directional extension of the second conductive line LNb—its closest conductive line, excepting of course the first conductive line LNa associated with the first conductive pad PDa. And similar relationships between respective major axis directional orientations and respective directional extensions for closest conductive lines between: the second opening OPb and the sixth conductive line LNf; the third opening OPc and the sixth conductive line LNf; the fourth opening OPd and the eighth conductive line LNh; the fifth opening OPe and the first conductive line LNa; the sixth opening OPf and the fifth conductive line LNe; the seventh opening OPg and the sixth conductive line LNf; and the eighth opening OPh and the seventh conductive line LNg.

Thus, the illustrated example of FIG. 2 shows how a relatively complex mosaic of openings and associated conductive lines—potentially having a great variety of directional extensions (e.g., the first horizontal direction, the second horizontal direction and one or more angular direction(s))—may be laid out consistent with embodiments of the inventive concept in order to minimize damage to any one of the conductive lines potentially caused by cracking induced by misalignment(s) between one or more of the opening(s) and associated conductive pad(s).

Figure 3:
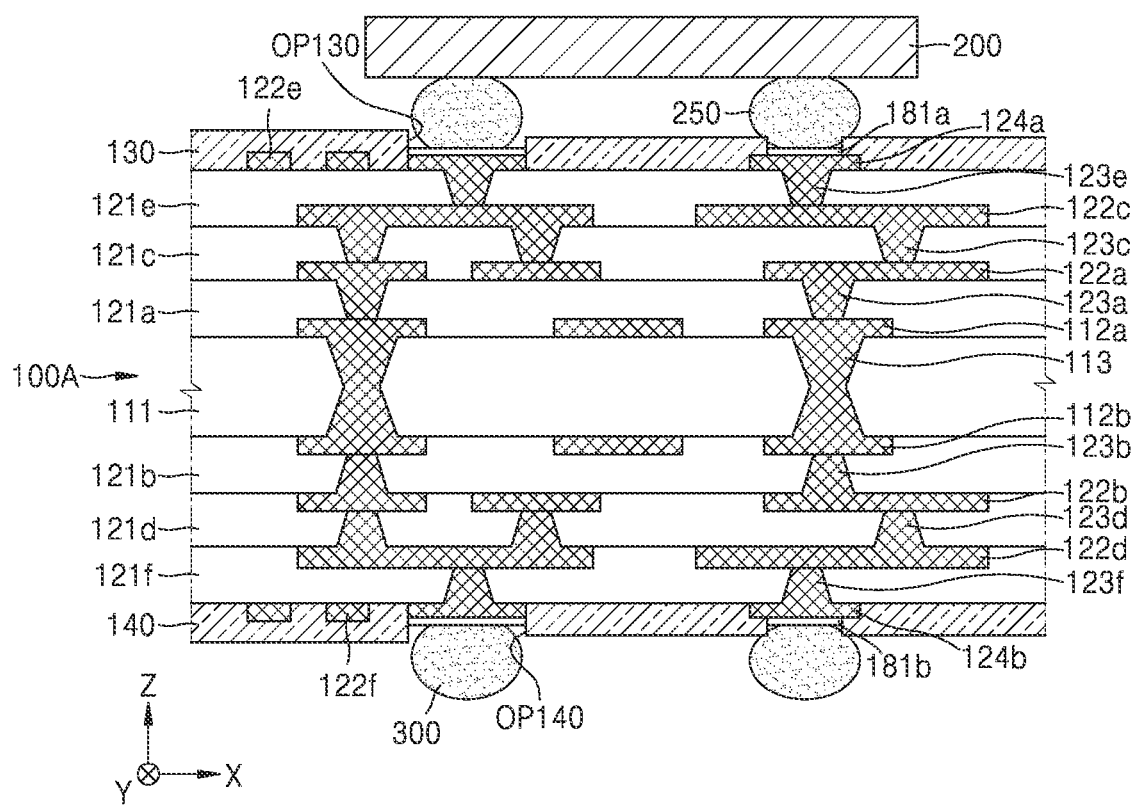
FIGS. 3, 4, 5, 6, and 7 are respective cross-sectional views of various semiconductor packages according to embodiments of the inventive concept.

FIG. 3 is a cross-sectional view of a semiconductor package 1000A according to embodiments of the inventive concept.

Referring to FIG. 3, the semiconductor package 1000A may include a package substrate 100A, a semiconductor chip 200 on an upper surface of the package substrate 100A, a chip bump 250 between the package substrate 100A and the semiconductor chip 200, and an external connection terminal 300 on a lower surface of the package substrate 100A.

In some embodiments, the package substrate 100A may include a printed circuit board (PCB). For example, the package substrate 100A may include a core layer 111, a first insulating layer 121a on an upper surface of the core layer 111, a second insulating layer 121b on a lower surface of the core layer 111, a third insulating layer 121c on an upper surface of the insulating layer 121a, a fourth insulating layer 121d on a lower surface of the second insulating layer 121b, a fifth insulating layer 121e on an upper surface of the third insulating layer 121c, and a sixth insulating layer 121f on a lower surface of the fourth insulating layer 121d.

The package substrate 100A may further include a core via 113 penetrating through the core layer 111. The package substrate 100A may further include a first core wiring layer 112a positioned on the upper surface of the core layer 111 and contacting the core via 113 and a second core wiring layer 112b positioned on the lower surface of the core layer 111 and contacting the core via 113.

The package substrate 100A may include a first wiring layer 122a on the upper surface of the first insulating layer 121a, a first via layer 123a penetrating through the first insulating layer 121a between the first wiring layer 122a and the first core wiring layer 112a, a second wiring layer 122b on the lower surface of the second insulating layer 121b, a second via layer 123b penetrating through the second insulating layer 121b between the second wiring layer 122b and the second core wiring layer 112b, a third wiring layer 122c on the upper surface of the third insulating layer 121c, a third via layer 123c penetrating through the third insulating layer 121c between the third wiring layer 122c and the first wiring layer 122a, a fourth wiring layer 122d on the lower surface of the fourth insulating layer 121d, a fourth via layer 123d penetrating through the fourth insulating layer 121d between the fourth wiring layer 122d and the second wiring layer 122b, first conductive pads 124a on an upper surface of the fifth insulating layer 121e, first conductive lines 122e on the upper surface of the fifth insulating layer 121e, a fifth via layer 123e penetrating through the fifth insulating layer 121e between the third wiring layer 122c and the first conductive pads 124a, second conductive pads 124b on a lower surface of the sixth insulating layer 121f, second conductive lines 122f on the lower surface of the sixth insulating layer 121f, and a sixth via layer 123f penetrating through the sixth insulating layer 121f between the fourth wiring layer 122d and the second conductive pads 124b.

While the package substrate 100A of FIG. 3 is assumed to include six insulating layers, as an example, four wiring layers, and six via layers, those skilled in the art will appreciate that any reasonable number of such insulating layers, wiring layers, and via layers may be included in various embodiments of the inventive concept. And this is true for the constituent components and elements of all other specific teaching examples presented in the written description.

The core layer 111 may include an insulating material (e.g., a thermosetting resin such as an epoxy resin or a thermoplastic resin such as polyimide). The core layer 111 may include a material including a reinforcing material such as glass fiber and/or inorganic filler, for example, a copper clad laminate (CCL) or an unclad CCL. The core layer 111 may include a metal plate, a glass plate, and/or a ceramic plate.

The first through sixth insulating layers 121a through 121f may include a thermosetting resin such as epoxy or a thermoplastic resin such as polyimide. In some embodiments, the first through sixth insulating layers 121a through 121f may include, in addition to a thermoplastic resin and/or a thermosetting resin, a material including a reinforcing material such as glass fiber and/or inorganic filler, for example, prepreg or Ajinomoto build-up film (ABF).

The core via 113, the first and second core wiring layers 112a and 112b, the first through fourth wiring layers 122a through 122d, the first through sixth via layers 123a through 123f, the first and second conductive pads 124a and 124b, and the first and second conductive lines 122e and 122f may include a metal material. The metal material may include at least one of copper (Cu), aluminum (Al), silver (Ag), tin (Sn), gold (Au), nickel (Ni), lead (Pb), and titanium (Ti).

The package substrate 100A may further include a first protective layer 130 on an upper surface of the fifth insulating layer 122e and a second protective layer 140 on the lower surface of the sixth insulating layer 121f. The first protective layer 130 may cover the first conductive lines 122e and the first conductive pads 124a. The first protective layer 130 may include first openings OP130 selectively exposing the first conductive pads 124a. The second protective layer 140 may cover the second conductive lines 122f and the second conductive pads 124b. The second protective layer 140 may include second openings OP140 selectively exposing the second conductive pads 124b. In some embodiments, the first protective layer 130 and the second protective layer 140 may include solder resist.

In some embodiments, consistent with the embodiments of FIGS. 1A, 1B, 1C and 2, each of the first openings OP130 may have an elongated shape defined by an orientation direction of a major axis. That is, the orientation direction of the first openings OP130 may be respectively perpendicular to an extension direction of a closest conductive line among the first conductive lines 122e. Accordingly, the first conductive lines 122e may be protected from possible crack propagation caused by applied thermal and/or mechanical stress. In some embodiments, each of the second openings OP140 may similar have an elongated shape defined by the orientation direction of a major axis. That is, the orientation direction of the second openings OP140 may be respectively perpendicular to an extension direction of a closest conductive line among the second conductive lines 122f. Accordingly, the second conductive lines 122f may be protected from possible crack propagation caused by applied thermal and/or mechanical stress. In some embodiments, at least one of the first opening OP130 and the second opening OP140 may be circular in shape.

The semiconductor chip 200 may include any type of integrated circuit including a memory circuit, a logic circuit, or a combination thereof. The memory circuit may include, for example, a dynamic random access memory (DRAM) circuit, a static random access memory (SRAM) circuit, a flash memory circuit, and an electrically erasable and programmable read-only memory (EEPROM) circuit, a phase-change random access memory (PRAM) circuit, a magnetic random access memory (MRAM) circuit, a resistive random access memory (RRAM) circuit, or a combination thereof. The logic circuit may include, for example, a central processing unit (CPU) circuit, a graphic processing unit (GPU) circuit, a controller circuit, an application specific integrated circuit (ASIC) circuit, an application processor (AP) circuit, or a combination thereof.

The chip bumps 250 may respectively contact the first conductive pads 124a. Each chip bump 250 may include tin (Sn) or a tin (Sn) alloy. In some embodiments, each chip bump 250 may include a solder ball. In some embodiments, the package substrate 100A may further include a first pad protective layer 181a between each chip bump 259 and each first conductive pad 124a.

External connection terminals 300 may directly contact the second conductive pads 124b. Each external connection terminal 300 may include tin (Sn) or a tin (Sn) alloy. In some embodiments, the external connection terminals 300 may include a solder ball. In some embodiments, the package substrate 100A may further include a second pad protective layer 181b between each external connection terminal 300 and each second conductive pad 124b.

Figure 4:
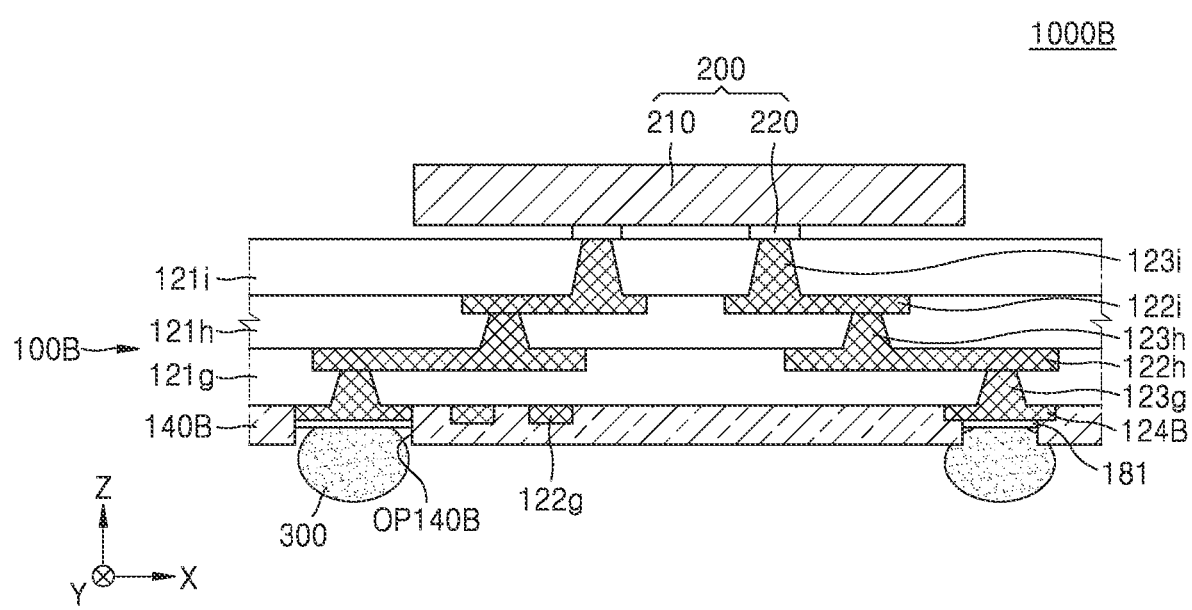

FIG. 4 is a cross-sectional view of another semiconductor package 1000B according to embodiments of the inventive concept. (Hereafter, only material differences between respective embodiments of various semiconductor packages consistent with the inventive concept will be highlighted for the sake of brevity).

Referring to FIG. 4, the semiconductor package 1000B may include a package substrate 100B, a second semiconductor chip 200 on an upper surface of the package substrate 100B, and an external connection terminal on a lower surface of the package substrate 100B. The second semiconductor chip 200 may include a body 210 and a chip pad 220 on a lower surface of the body 210. The body 210 may include an integrated circuit.

In some embodiments, the package substrate 100B may be a redistribution layer (RDL). For example, the package substrate 100B may include a first insulating layer 121i, a second insulating layer 121h on a lower surface of the first insulating layer 121i, a third insulating layer 121g on a lower surface of the second insulating layer 121h, and a protective layer 140B on a lower surface of the third insulating layer 121g.

The first through third insulating layers 121i through 121g may include an insulating material that may include an inorganic insulating material such as silicon oxide, silicon nitride, phosphosilicate glass (PSG), borophosphosilicate (BPSG), fluorosilicate glass (FSG), or a combination thereof, an organic insulating material such as an insulating polymer, or a combination thereof. In some embodiments, the first through third insulating layers 121i through 121g may include a photosensitive material, for example, photosensitive polyimide.

The protective layer 140B may include a thermosetting resin such as an epoxy resin or a thermoplastic resin such as polyimide. The protective layer 140B may include a material obtained by adding an inorganic filler and/or glass fiber to the above-described resin, for example, prepreg, ABF, FR-4, or bismaleimide triazine (BT). In some embodiments, the protective layer 140B may include solder resist.

The package substrate 100B may further include a first wiring layer 122i on the lower surface of the first insulating layer 121i, a first via layer 123i penetrating through the first insulating layer 121i between the first wiring layer 122i and the chip pad 220, a second wiring layer 122h on the lower surface of the second insulating layer 121h, a second via layer 123h penetrating through the second insulating layer 121h between the second wiring layer 122h and the first wiring layer 122i, conductive pads 124B on the lower surface of the third insulating layer 121g, conductive lines 122g on the lower surface of the third insulating layer 121g, and a third via layer 123g penetrating through the third insulating layer 121g between the conductive pads 124B and the second wiring layer 122h. The first and second wiring layers 122i and 122h, the first through third via layers 123i through 123g, the conductive pads 124B, and the conductive lines 122g may include at least one of copper (Cu), aluminum (Al), silver (Ag), gold (Au), tungsten (W), titanium (Ti), and nickel (Ni).

While the package substrate 100B is assumed to include three insulating layers, two wiring layers, and three via layers, any reasonable number of insulating layers, wiring layers, and via layers may be included in the package substrate 100B as variously modified per differing embodiments.

The protective layer 140B may cover a portion of the conductive pads 124B, as well as and the conductive lines 122g. The protective layer 140B may include an opening OP140B selectively exposing a center portion of each conductive pad 124B, and remaining portions of the conductive pad 124B may not be covered by the protective layer 140B. In some embodiments, each of the openings OP140B may have an elongated shape defined by an orientation direction of a major axis. The orientation direction of the openings OP140B may be substantially perpendicular to an extension direction of a closest conductive line among the conductive lines 122g. Accordingly, the conductive lines 122g may be protected from possible crack propagation caused by applied thermal and/or mechanical stress.

The external connection terminal 300 may directly contact the conductive pad 124B, and may include tin (Sn) or a tin (Sn) alloy. In some embodiments, the external connection terminal 300 may include a solder ball. In some embodiments, the package substrate 100B may further include a pad protective layer 181 between each external connection terminal 300 and each conductive pad 124B.

Figure 5:
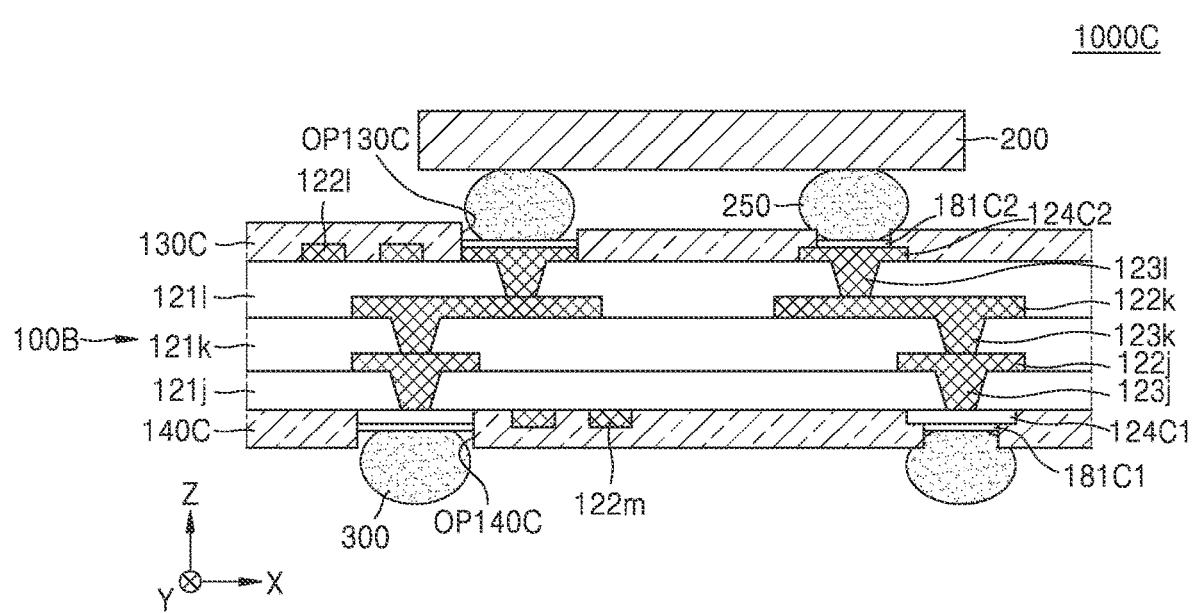

FIG. 5 is a cross-sectional view of a semiconductor package 1000C according to embodiments of the inventive concept.

Referring to FIG. 5, the semiconductor package 1000C may include a package substrate 100C, a semiconductor chip 200 on an upper surface of the package substrate 100C, and a chip bump 250 between the semiconductor chip 200 and the package substrate 100C, and an external connection terminal 300 on a lower surface of the package substrate 100C.

The package substrate 100C may include a first insulating layer 121j, a second insulating layer 121k on an upper surface of the first insulating layer 121j, and a third insulating layer 121l on an upper surface of the second insulating layer 121k, a first protective layer 140C on a lower surface of the first insulating layer 121j, and a second protective layer 130C on an upper surface of the third insulating layer 121l. However, in some embodiments, one of the first and second protective layers 140C and 130C may be omitted.

The first through third insulating layers 121j through 121l may include, for example, an inorganic insulating material such as silicon oxide, silicon nitride, PSG, BPSG, FSG, or a combination thereof, an organic insulating material such as an insulating polymer, or an insulating material that may include a combination thereof. In some embodiments, the first through third insulating layers 121j through 121l may include a photosensitive material, for example, photosensitive polyimide.

The first and second protective layers 140C and 130C may include a thermosetting resin such as epoxy or a thermoplastic resin such as polyimide. The first and second protective layers 140C and 130C may include a material obtained by adding an inorganic filler and/or glass fiber to the above-described resin, for example, prepreg, ABF, FR-4, or BT. In some embodiments, the first and second protective layers 140C and 130C may include solder resist.

The package substrate 100C may include first conductive pads 124C1 on the lower surface of the first insulating layer 121j, first conductive lines 122m on the lower surface of the first insulating layer 121j, a first wiring layer 122j on an upper surface of the first insulating layer 121i, a first via layer 123j penetrating through the first insulating layer 121j between the first conductive pads 124C1 and the first wiring layer 122j, a second wiring layer 122k on the upper surface of the second insulating layer 121k, a second via layer 123k penetrating through the second insulating layer 121k between the second wiring layer 122k and the first wiring layer 122j, second conductive pads 124C2 on the upper surface of the third insulating layer 121l, second conductive lines 122l on the upper surface of the third insulating layer 121l, and a third via layer 123l penetrating through the third insulating layer 121l between the second conductive pads 124C2 and the second wiring layer 122k. The first and second wiring layers 122j and 122k, the first through third via layers 123j through 123l, the first and second conductive pads 124C1 and 124C2, and the first and second conductive lines 122m and 122l may include at least one of copper (Cu), aluminum (Al), silver (Ag), gold (Au), tungsten (W), and titanium (Ti).

While the package substrate 100C is assumed to include three insulating layers, two wiring layers, and three via layers, any reasonable number of insulating layers, wiring layers, and/or via layers may be included in the package substrate 100C.

The first protective layer 140C may cover a portion of the first conductive pads 124C1 as well as the first conductive lines 122m. The first protective layer 140C may include first openings OP140C selectively exposing a portion of the first conductive pads 124C1. A portion of the first conductive pads 124C1 may not be covered by the first protective layer 140C, but the remaining portion of the first conductive pad 124C1 may be covered by the first protective layer 140C. In some embodiments, each first openings OP140C may have an elongated shape defined by a directional orientation of a major axis, wherein the directional orientation of the major axis of the first openings OP140C may be substantially perpendicular to a directional extension of a closest conductive line among the first conductive lines 122m extends. Accordingly, the first conductive lines 122m may be protected from possible crack propagation caused by applied thermal and/or mechanical stress.

The second protective layer 130C may cover a portion of the second conductive pads 124C2 as well as the second conductive lines 122l. The second protective layer 130C may include second openings OP130C selectively exposing a center portion of the respective second conductive pads 124C2, but covering remaining portions of the second conductive pads 124C2. In some embodiments, each of the second openings OP130C may have an elongated shape defined by a directional orientation of a major axis that is substantially perpendicular to a directional extension of a closest conductive line among the second conductive lines 122*l*. Accordingly, the second conductive lines 122*l* may be protected from possible crack propagation caused by applied thermal and/or mechanical stress. In some embodiments, at least one of the first openings OP140C and the second openings OP130C may be circular in shape.

Respective external connection terminals 300 may directly contact respective first conductive pads 124C1. Each external connection terminal 300 may include tin (Sn) or a tin (Sn) alloy. In some embodiments, each of the external connection terminal 300 may include a solder ball. In some embodiments, the package substrate 100C may further include a first pad protective layer 181C1 between each external connection terminal 300 and each first conductive pad 124C1.

Respective chip bumps 250 may contact respective second conductive pads 124C2. The chip bumps 250 may include a solder or metal, where the solder may include tin (Sn) or a tin (Sn) alloy. The metal may include at least one of copper (Cu), nickel (Ni), gold (Au), silver (Ag), aluminum (Al), tungsten (W) and titanium (Ti). In some embodiments, the package substrate 100C may further include a second pad protective layer 181C2 between each chip bump 250 and each second conductive pad 124C2.

Figure 6:
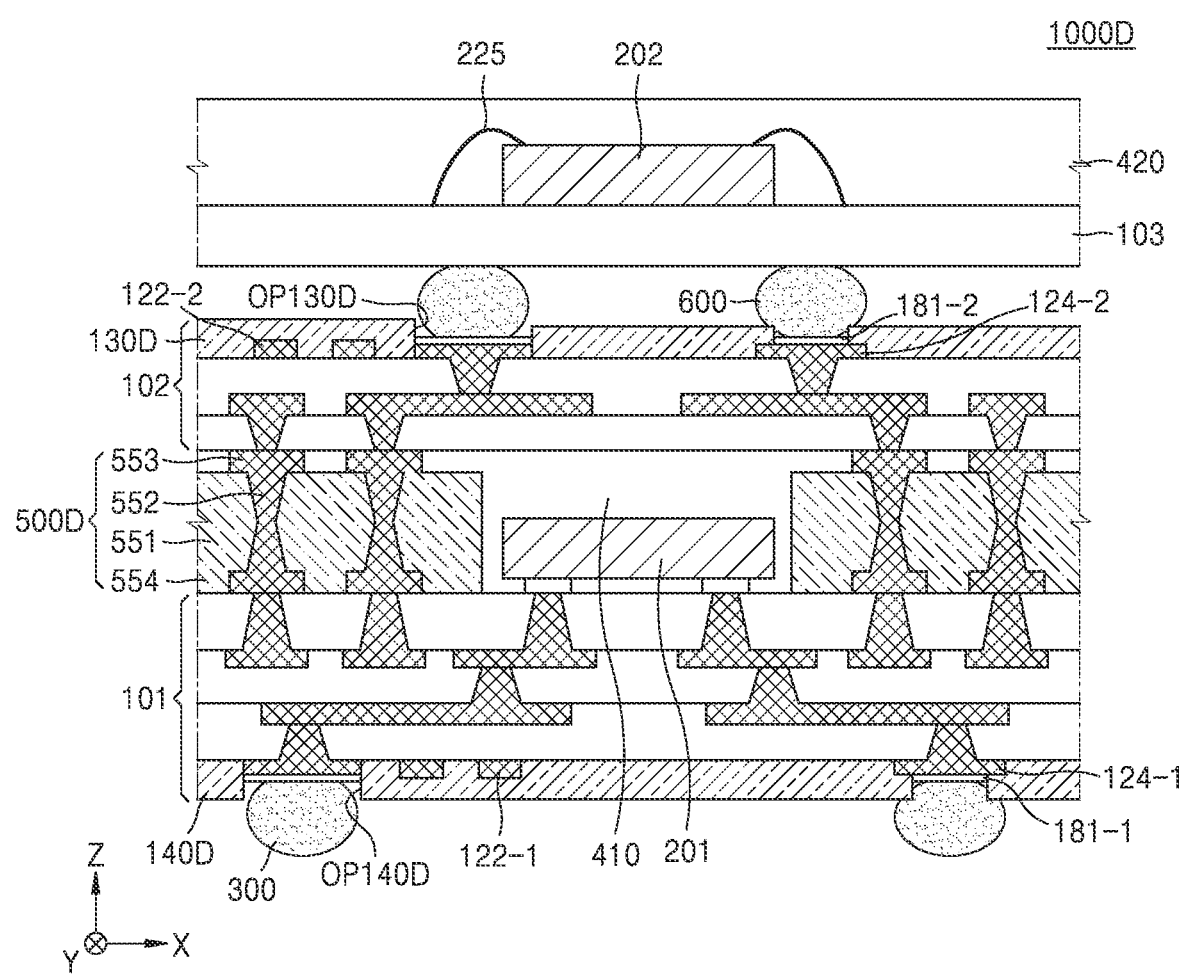

FIG. 6 is a cross-sectional view illustrating a semiconductor package 1000D according to embodiments of the inventive concept.

Referring to FIG. 6, the semiconductor package 1000D may include a first package substrate 101, an external connection terminal 300 on a lower surface of the first package substrate 101, an inter-substrate connection structure 500D on an upper surface of the first package substrate 101, a first semiconductor chip 201 on the upper surface of the first package substrate 101, a first molding 410 covering the first semiconductor chip 201 and the first package substrate 101, and a second package substrate 102 on the first molding 410 and the inter-substrate connection structure 500D. In some embodiments, the semiconductor package 1000D may further include an inter-sub-package connection member 600 on the second package substrate 102, a third package substrate 103 on the inter-sub-package connection member 600, a second semiconductor chip 202 on the third package substrate 103, and a second molding 420 covering the second semiconductor chip 202 and the third package substrate 103. The semiconductor package 1000D may further include a chip connecting member 225 connecting the second semiconductor chip 202 to the third package substrate 103.

In some embodiments, the first package substrate 101, the inter-substrate connection structure 500D, the first semiconductor chip 201, the first molding 410, and the second package substrate 102 may constitute a first sub-package. In addition, the third package substrate 103, the second semiconductor chip 202, and the second molding 420 may constitute a second sub-package. The second sub-package may be disposed on the first sub-package, and the first sub-package and the second sub-package may be interconnected using the inter-sub-package connection member 600. That is, the semiconductor package 1000D may be a package-on-package (POP) type device.

The first package substrate 101 may include a redistribution layer. The first package substrate 101 may include a first conductive line 122-1, a first conductive pad 124-1 spaced apart from the first conductive line 122-1, and a first protective layer 140D covering the first conductive line 122-1 and the first conductive pad 124-1. The first protective layer 140D may include first openings OP140D exposing a portion of the first conductive pad 124-1. Consistent with the foregoing, the first openings OP140D may have an elongated shape defined by the orientation direction of a major axis that is substantially perpendicular to a directional extension of a closest conductive line among the first conductive lines 122-1. Accordingly, the first conductive lines 122-1 may be protected from possible crack propagation caused by applied thermal and/or mechanical stress. In another embodiment, the first openings OP140D may be circular in shape.

Respective external connection terminals 300 may directly contact respective first conductive pads 124-1. Each external connection terminal 300 may include tin (Sn) or a tin (Sn) alloy. In some embodiments, the external connection terminal 300 may include a solder ball. In some embodiments, the first package substrate 101 may further include a first pad protective layer 181-1 between the external connection terminal 300 and the first conductive pad 124-1.

The inter-substrate connection structure 500D may include a lower pad 554 on the first package substrate 101, an insulating frame 551 on the first package substrate 101 and the lower pad 554, an upper pad 553 on an upper surface of the insulating frame 551, and a via penetrating through the insulating frame 551 between the lower pad 554 and the upper pad 553.

In some embodiments, the insulating frame 551 may include stacked insulating layers. The insulating frame 551 may include a thermosetting resin such as an epoxy resin or a thermoplastic resin such as polyimide. The insulating frame 551 may include a material obtained by adding an inorganic filler and/or glass fiber to the above-described resin, for example, prepreg, ABF, FR-4, or BT. In some embodiments, the insulating frame 551 may include a photo imagable dielectric (PID) resin. The upper pad 553, the lower pad 554, and the via 552 may include at least one of copper (Cu), aluminum (Al), silver (Ag), gold (Au), tungsten (W), titanium (Ti), and nickel (Ni).

In some embodiments, the first semiconductor chip 201 may include a different integrated circuit (e.g., a different type of integrated circuit) as compared with the second semiconductor chip 202. For example, the first semiconductor chip 201 may include an circuitry implementing an AP, while the second semiconductor chip 202 may include circuitry implementing a DRAM.

The first and second moldings 410 and 420 may include, for example, at least one of thermosetting resin, a thermoplastic resin, and an ultraviolet (UV) curable resin. The first and second moldings 410 and 420 may include, for example, at least one of an epoxy resin and a silicone resin. Alternately, the first and second moldings 410 and 420 may include an epoxy mold compound (EMC).

The second package substrate 102 may include a redistribution layer. The second package substrate 102 may include a second conductive line 122-2, a second conductive pad 124-2 laterally spaced apart from the second conductive line 122-2, and a second protective layer 130D covering the second conductive line 122-2 and at least a portion of the second conductive pad 124-2. For example, the second protective layer 130D may include second openings OP130D selectively exposing a center portion of the second conductive pad 124-2. The second openings OP130D may have an elongated shape defined by an directional orientation of a major axis that may be substantially perpendicular to a directional extension of a closet second conductive line among the second conductive lines 122-2. Accordingly, the second conductive lines 122-2 may be protected from possible crack propagation caused by applied thermal and/or mechanical stress.

In various embodiments, the third package substrate 103 may be implemented using a PCB or a redistribution layer. In some embodiments, the third package substrate 103 may be implemented as any one of the package substrates 100A, 100B and 100C of FIGS. 3, 4 and 5.

The inter-sub-package connection member 600 may contact the second conductive pad 124-2. The inter-sub-package connection member 600 may include tin (Sn) or a tin (Sn) alloy. In some embodiments, the inter-sub-package connection member 600 may include a solder ball. In some embodiments, the second package substrate 102 may further include a second pad protective layer 181-2 between the inter-sub-package connection member 600 and the second conductive pad 124-2. In some embodiments, the second pad protective layer 181-2 may include gold (Au) or a gold (Au)-alloy.

The chip connecting member 225 may include a wire extending from an upper surface of the second semiconductor chip 202 to an upper surface of the third package substrate 103. Alternately, the chip connecting member 225 may include a chip bump between a lower surface of the second semiconductor chip 202 and the upper surface of the third package substrate 103.

Figure 7:
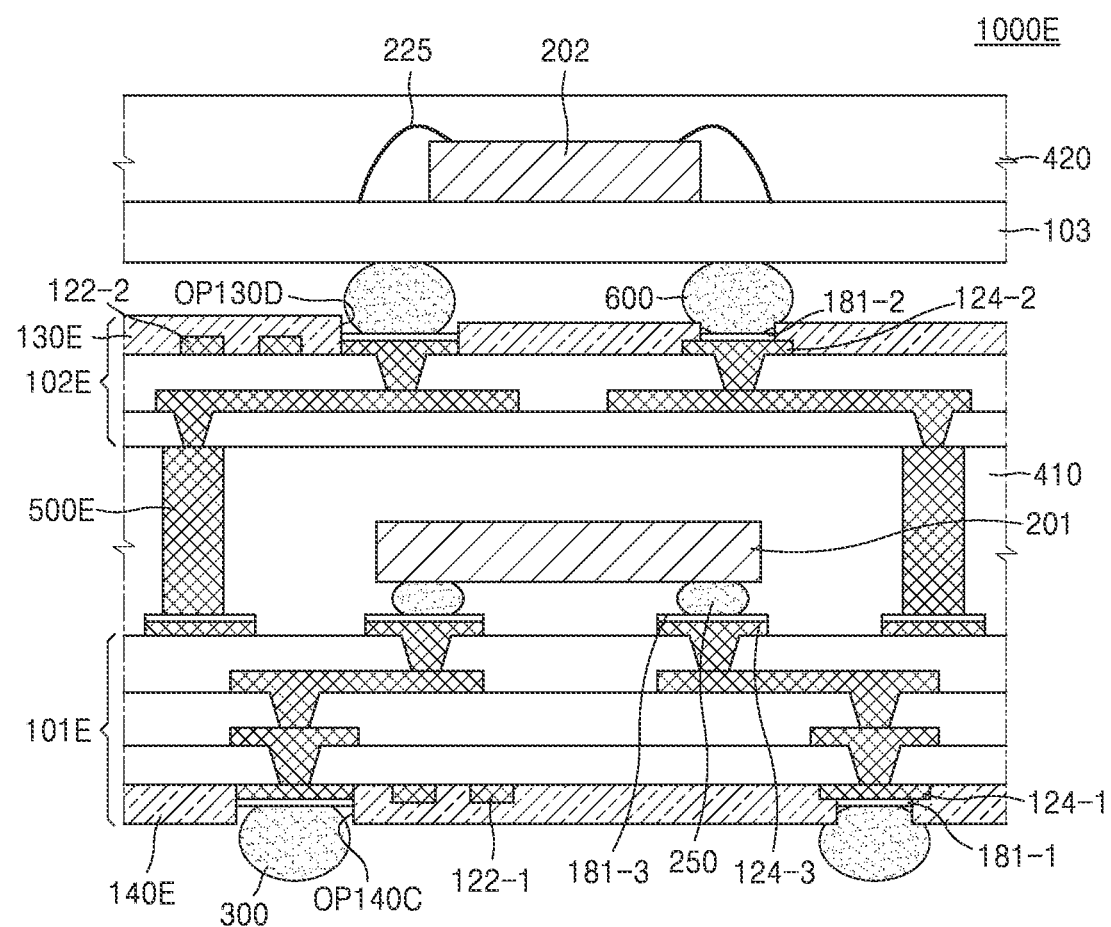

FIG. 7 is a cross-sectional view illustrating a semiconductor package 1000E according to embodiments of the inventive concept, and may be compared with the semiconductor package 1000D of FIG. 6.

Referring to FIG. 7, a first package substrate 101E may further include third conductive pads 124-3. The first package substrate 101E may further include a third pad protective layer 181-3 on the third conductive pads 124-3. The first semiconductor chip 201 may contact the third conductive pads 124-3 via the chip bump 250. The chip bumps 250 may be disposed on some of the third conductive pads 124-3. Inter-substrate connection structures 500E may be disposed on the other third conductive pads 124-3. The inter-substrate connection structures 500E may include a conductive pillar. The conductive pillar may extend from the first package substrate 101E to a second package substrate 102E. The conductive pillar may include at least one of copper (Cu), aluminum (Al), silver (Ag), gold (Au), tungsten (W), titanium (Ti), and nickel (Ni).

Figure 8A:
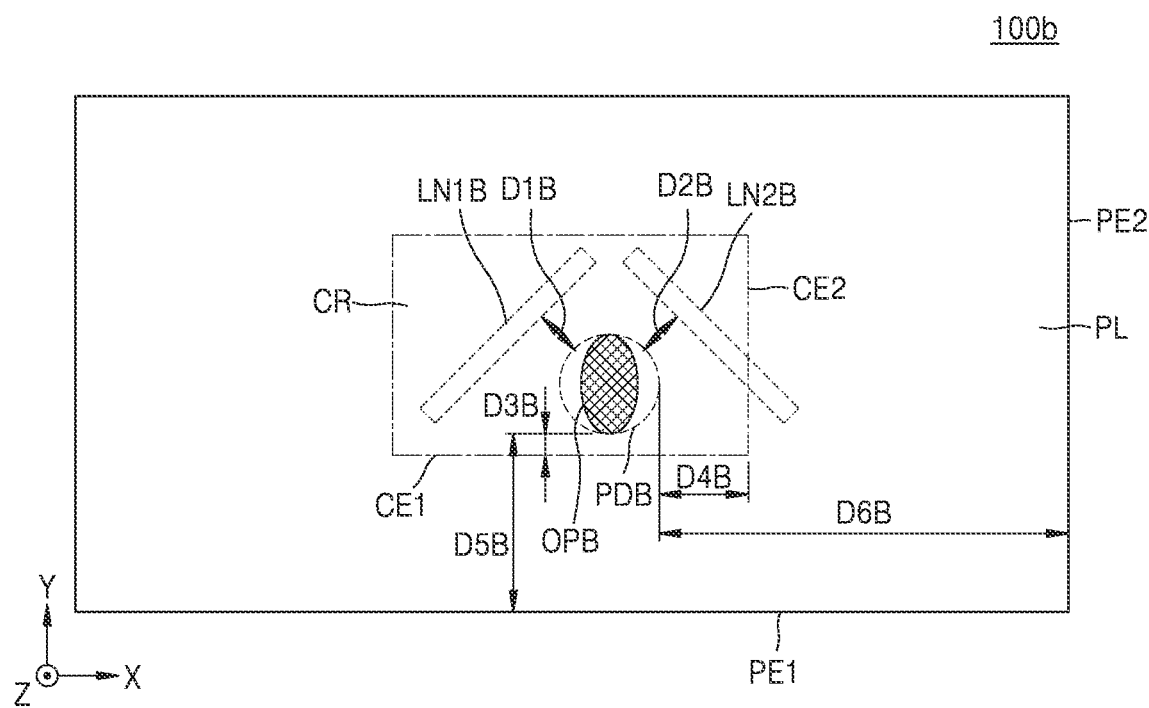
FIGS. 8A, 8B, 8C and 8D are respective plan views of various package substrates according to embodiments of the inventive concept.

FIG. 8A is a plan view illustrating a package substrate 100b that may be incorporated into a semiconductor package according to embodiments of the inventive concept.

Referring to FIG. 8A, the package substrate 100b may include a first angular conductive line LN1B, a second angular conductive line LN2B, a conductive pad PDB, and a protective layer PL. The first angular conductive line LN1B may extend in a first angular direction, and the second conductive line LN2B may extend in a second angular direction different from the first angular direction. Here, the conductive pad PDB may be laterally spaced apart from both the first conductive line LN1B and the second conductive line LN2B. For example, a first perpendicular distance D1B separating the conductive pad PDB from the first conductive line LN1B may be substantially equal to a second perpendicular distance D2B separating the conductive pad PDB from the second conductive line LN2B. In this context, a "perpendicular distance" may denote a shortest distance (regardless of direction) between a closest point along an edge of a conductive line and a closest point on an outer (circumferential) edge of a conductive pad.

Consistent with the foregoing, the protective layer PL may cover the first conductive line LN1B, the second conductive line LN2B, and at least a portion of the conductive PDB. That is, the protective layer PL may include an opening OPB selectively exposing a center portion of the conductive pad PDB.

Here, the major axis of the opening OPB may be understood as extending in a major axis direction, and the minor axis of the opening OPB may be understood as extending in a minor axis direction. Thus, the opening OPB may be elongated in the major axis direction, irrespective of the first angular direction of the first angular conductive line LN1B and the second angular direction of the second angular conductive line LN2B.

Instead, the major axis direction of the opening OPB may be oriented to be substantially perpendicular to a "closest chip edge" (e.g., one of a first chip edge CE1, a second chip edge CE2, a first package edge PE1, and a second package edge PE2, as shown in FIG. 8A). With this configuration, a crack beginning at the outer (circumferential) edge of the conductive pad PDB will be much more likely to propagated in a direction substantially in parallel with the closest chip edge. Accordingly, the closest chip edge related to the conductive pad PDB may be protected from possible cracking by orienting the major axis of the opening OPB to be substantially perpendicular to the closest chip edge.

In this regard and referring to FIGS. 3, 4, 5, 6, 7 and 8A, a chip region CR may be a region of the package substrate 100b in which the semiconductor chip 200 or the first semiconductor chip 201 may be mounted (e.g., mechanically assembled and/or electrically connected) in the vertical direction. Thus, with reference to the illustrated embodiment of FIG. 8A, the chip region CR may include the first chip edge CE1 extending substantially in the first horizontal direction, and the second chip edge CE2 extending substantially in the second horizontal direction substantially perpendicular to the first horizontal direction.

Further, the package substrate 100b may include the first package substrate PE1 extending substantially in the first horizontal direction, and the second package edge PE2 extending substantially in the second horizontal direction, wherein each one of the first chip edge CE1, the second chip edge CE2, the first package edge PE1, and the second package edge PE2 may be vulnerable to crack propagation. Accordingly, each one of the first chip edge CE1, the second chip edge CE2, the first package edge PE1, and the second package edge PE2 should be protected from crack propagation.

In the illustrated embodiment of FIG. 8A, the conductive pad PDB may be closest to the first chip edge CE1. That is, a third distance D3B (e.g., measured in the second horizontal direction) from the outer edge of the conductive pad PDB to the first chip edge CE1 may be less than a fourth distance D4B (e.g., measured in the first horizontal direction) from the outer edge of the conductive pad PDB to the second chip edge CE2, a fifth distance D5B (e.g., measured in the second horizontal direction) from the outer edge of the conductive pad PDB to the first package edge PE1, and a sixth distance D6B (e.g., measured in the first horizontal direction) from the outer edge of the conductive pad PDB to the second package edge PE.

Accordingly, the major axis direction of the opening OPB should be oriented to be substantially perpendicular to the first chip edge CE1. Accordingly, a crack beginning at the outer edge of the conductive pad PDB will more likely be propagated in a direction parallel to the first chip edge CE1, thereby protecting the first chip edge CE1 from cracks.

Figure 8B:
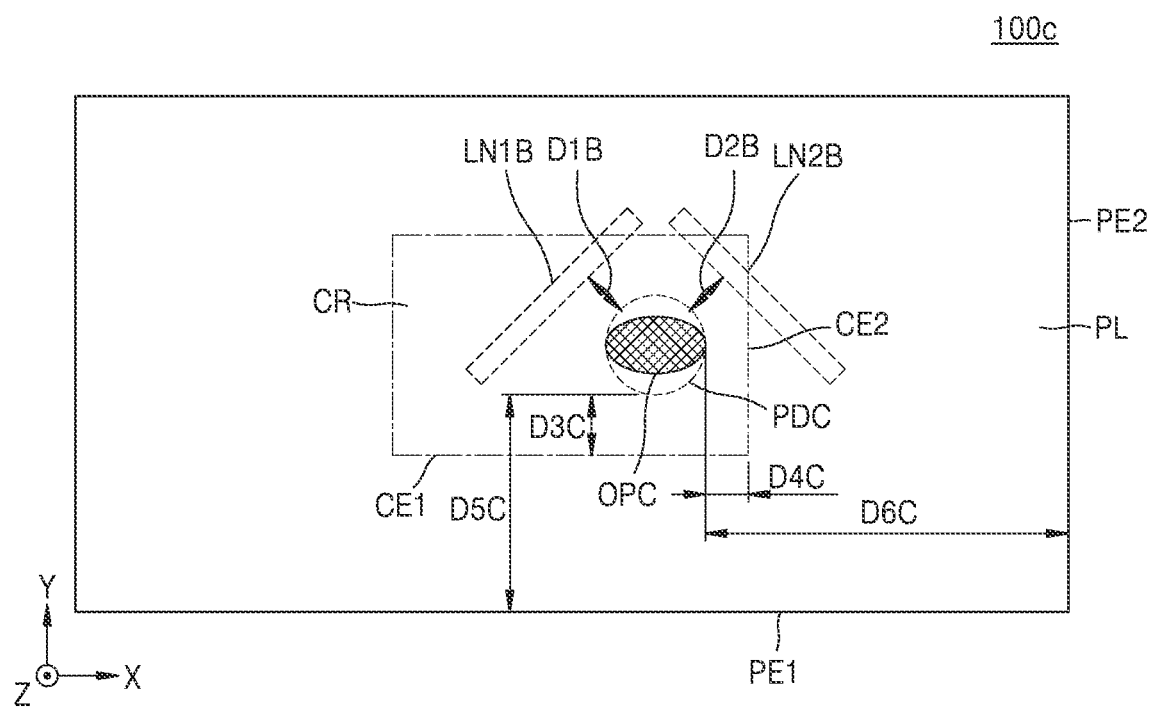

FIG. 8B is a plan view of a package substrate 100c that may be incorporated into a semiconductor package according to embodiments of the inventive concept and may be compared with the package substrate 100b of FIG. 8A.

Referring to FIGS. 8A and 8B, a conductive pad PDC is assumed to closest to the second chip edge CE2. That is, a fourth distance D4C from the outer edge of the conductive pad PDC to the second chip edge CE2, may be less than a third distance D3C from the outer edge of the conductive pad PDC to the first chip edge CE1, a fifth distance D5C from the outer edge of the conductive pad PDC to the first package edge PE1, and a sixth distance D6C from the outer edge of the conductive pad PDC to the second package edge PE. Accordingly, the major axis direction for the opening OPC may be oriented to be substantially perpendicular to the second chip edge CE2. Thus, a crack beginning at the outer edge of the conductive pad PDC is more likely to propagated in parallel with the second chip edge CE2, thereby protecting the second chip edge CE2.

Figure 8C:
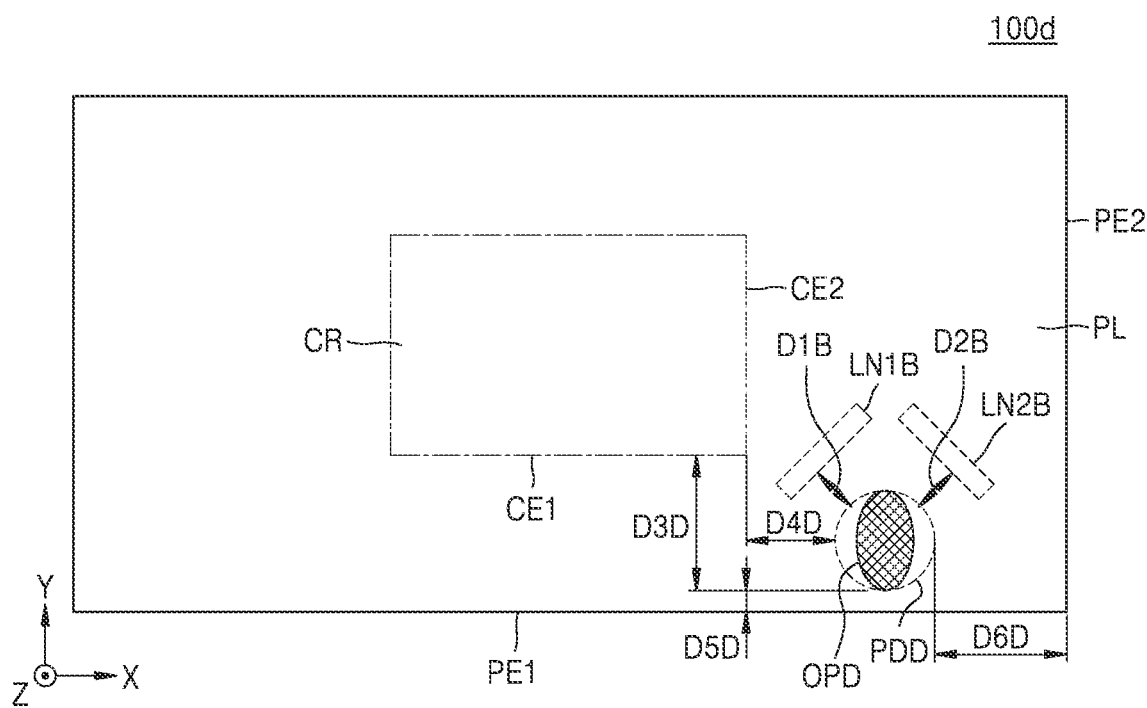

FIG. 8C is a plan view of a package substrate 100d that may be incorporated into a semiconductor package according to embodiments of the inventive concept, and may be compared with the package substrate 100b of FIG. 8A.

Referring to FIGS. 8A and 8C, a conductive pad PDD is assumed to be closest to the first package edge PE1. That is, a first distance D5D from the outer edge of the conductive pad PDD to the first package edge PE1 may be less than a third distance D3D from the outer edge of the conductive pad PDD to the first chip edge CE1, a fourth distance D4D from the outer edge of conductive pad PDD to the second chip edge CE2, and a sixth distance D6D from the outer edge of the conductive pad PDD to the second package edge PE2. Accordingly, the major axis direction for the opening OPD may be oriented to be substantially perpendicular to the first package edge PE1. Thus, a crack beginning at the outer edge of the conductive pad PDD will be more likely to propagated in parallel with the first package edge PE1, thereby protecting the first package edge PE1.

Figure 8D:
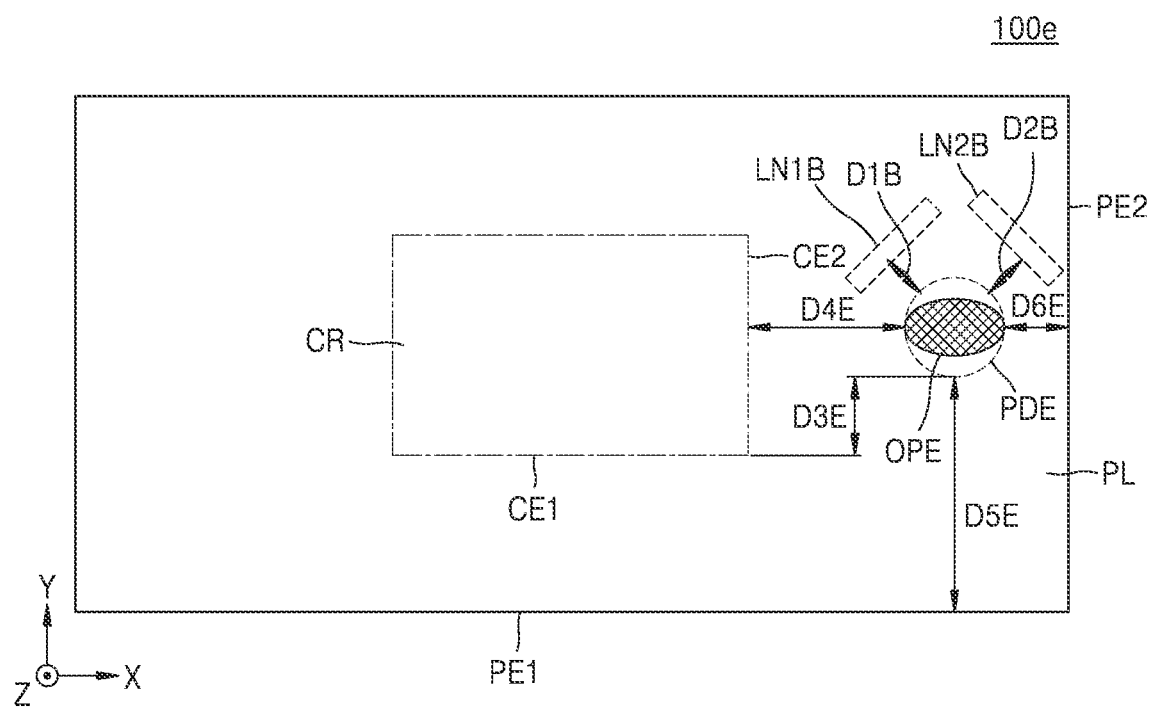

FIG. 8D is a plan view of a package substrate 100e that may be incorporated into a semiconductor package according to embodiments of the inventive concept and may be compared with the package substrate 100b of FIG. 8A.

Referring to FIGS. 8A and 8D, a conductive pad PDE is assumed to be closest to the second package edge PE2. That is, a sixth distance D6E from the outer edge of the conductive pad PDE to the second package edge PE2 may be less than a third distance D3E from the outer edge of the conductive pad PDE to the first chip edge CE1, a fourth distance D4E from the outer edge of the conductive pad PDE to the second chip edge CE2, and a fifth distance D5E from the outer edge of the conductive pad PDE to the first package edge PE1. Accordingly, the major axis direction of the opening OPE may be oriented to be substantially perpendicular to the second package edge PE2. Thus, a crack beginning at the outer edge of the conductive pad PDE may be more likely to propagated in parallel with the second package edge PE2, thereby protecting the second package edge PE2.

While the inventive concept has been particularly shown and described with reference to example embodiments thereof, it will be understood that various changes in form and details may be made therein without departing from the spirit and scope of the following claims.

What is claimed is:

1. A package substrate comprising:
a first conductive line extending in a first horizontal direction;
a first conductive pad on an upper surface of the package substrate and horizontally spaced apart from the first conductive line in a second horizontal direction, wherein the first conductive pad and the first conductive line do not overlap along a vertical direction perpendicular to the first and second horizontal directions; and
a protective layer covering the first conductive line and including a first opening selectively exposing a portion of the first conductive pad,
wherein the first opening has an elliptical shape having a minor axis defined by a first width extending in the first horizontal direction and a major axis defined by a first length extending in the second horizontal direction.

2. The package substrate of claim 1, wherein the first conductive pad has a second length in the second horizontal direction equal to the first length of the first opening.

3. The package substrate of claim 1, further comprising:
a second conductive line extending in the second horizontal direction; and
a second conductive pad on the upper surface of the package substrate, spaced apart from the second conductive line in the first horizontal direction, and spaced apart from the first conductive pad in the first horizontal direction,
wherein a distance between the first conductive line and the first conductive pad in the second horizontal direction is less than a distance between the second conductive line and the first conductive pad in the first horizontal direction.

4. The package substrate of claim 3, wherein the protective layer covers the second conductive line and further includes a second opening selectively exposing a portion of the second conductive pad,
the second opening has an elliptical shape having a minor axis defined by a third length extending in the second horizontal direction and a major axis defined by a second width extending in the first horizontal direction,
the first width is less than the second width,
the first conductive pad has a second length in the second horizontal direction, and
the first length and the second length are each greater than the third length.

5. The package substrate of claim 4, wherein the second conductive pad has a third width in the first horizontal direction equal to the second width of the second opening.

6. The package substrate of claim 4, wherein a distance between the second conductive line and the second conductive pad in the first horizontal direction is less than a distance between the first conductive line and the second conductive pad in the first horizontal direction.

7. The package substrate of claim 1, further comprising:
a second conductive line extending in the second horizontal direction;
a second conductive pad on the upper surface of the package substrate, spaced apart from the second conductive line in the first horizontal direction, and spaced apart from the first conductive pad in the first horizontal direction;
a first angular conductive line extending from the first conductive pad in a first angular direction; and
a second angular conductive line extending from the second conductive pad in a second angular direction different from the first angular direction.

8. The package substrate of claim 1, further comprising:
a second conductive pad on a lower surface of the package substrate;
a chip bump on the first conductive pad;

a semiconductor chip mounted on the upper surface of the package substrate in contact with the chip bump; and an external connection terminal on the lower surface of the package substrate in contact with the second conductive pad.

9. A semiconductor package comprising:

a first package substrate;

a first semiconductor chip mounted on the first package substrate;

a second package substrate on the first semiconductor chip;

an inter-substrate connection structure connecting the first package substrate and the second package substrate;

a third package substrate on the second package substrate; and an inter-sub-package connection member between the second package substrate and the third package substrate, wherein the second package substrate comprises:

a first conductive line having a first directional extension;

a first conductive pad on an upper surface of the second package substrate in contact with the inter-sub-package connection member, and spaced apart from the first conductive line, wherein the first conductive pad and the first conductive line do not overlap along a vertical direction perpendicular to the first directional extension; and a protective layer covering the first conductive line and including a first opening exposing a center portion of the first conductive pad, wherein the first opening has an elongated elliptical shape defined by a first minor axis and a first major axis, and a first directional orientation of the first major axis is perpendicular to the first directional extension of the first conductive line.

10. The semiconductor package of claim 9, wherein the third package substrate includes at least one of a printed circuit board and a redistribution line mounting a second semiconductor chip.

11. The semiconductor package of claim 10, wherein the first semiconductor chip is an application processor and the second semiconductor chip is a memory device.

12. The semiconductor package of claim 10, further comprising:

a first molding covering the first semiconductor chip and the first package substrate, wherein the second package substrate is disposed on an upper surface of the first molding and an upper surface of the inter-substrate connection structure; and a second molding covering the second semiconductor chip and the third package substrate.

13. The semiconductor package of claim 9, wherein a first length of the first conductive pad is equal to a second length of the first opening.

14. The semiconductor package of claim 9, further comprising:

a second conductive line having a second directional extension different from the first directional extension; and a second conductive pad spaced apart from the second conductive line and spaced apart from the first conductive pad, wherein a first distance between the first conductive line and the first conductive pad is less than a second distance between the second conductive line and the first conductive pad.

15. The semiconductor package of claim 14, wherein the protective layer covers the second conductive line and further includes a second opening exposing a center portion of the second conductive pad, and the second opening has an elongated elliptical shape defined by a second minor axis and a second major axis, and a second directional orientation of the second major axis is perpendicular to the second directional extension of the second conductive line.

16. A semiconductor device comprising:

a package substrate including a first package edge extending in a first horizontal direction, a second package edge extending in a second horizontal direction, and a chip region including a first chip edge extending in the first horizontal direction, a second chip edge extending in the second horizontal direction;

a protective layer covering an upper surface of the package substrate and including an opening; and a conductive pad including a center portion exposed through the opening of the protective layer and an outer portion covered by the protective layer, wherein the opening has an elongated elliptical shape having a minor axis and a major axis, and a directional orientation of the major axis is perpendicular to a closest one of the first package edge, the second package edge, the first chip edge and the second chip edge.

17. The semiconductor device of claim 16, wherein the conductive pad is disposed in the chip region and is disposed closest to the first chip edge, and the directional orientation of the major axis is perpendicular to the first horizontal direction.

18. The semiconductor device of claim 16, wherein the conductive pad is disposed in the chip region and is disposed closest to the second chip edge, and the directional orientation of the major axis is perpendicular to the second horizontal direction.

19. The semiconductor device of claim 16, wherein the conductive pad is disposed outside the chip region and is disposed closest to the first package edge, and the directional orientation of the major axis is perpendicular to the first horizontal direction.

20. The semiconductor device of claim 16, wherein the conductive pad is disposed outside the chip region and is disposed closest to the second package edge, and the directional orientation of the major axis is perpendicular to the second horizontal direction.

* * * * *